United States Patent
Yang et al.

(10) Patent No.: US 7,208,753 B2
(45) Date of Patent: Apr. 24, 2007

(54) ENHANCEMENT MODE SINGLE ELECTRON TRANSISTOR

(75) Inventors: Ming Yang, Silver Spring, MD (US); Chia-Hung Yang, Silver Spring, MD (US); Yuli Lyanda-Geller, West Lafayette, IN (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 11/307,830

(22) Filed: Feb. 24, 2006

(65) Prior Publication Data

US 2007/0063182 A1    Mar. 22, 2007

Related U.S. Application Data

(60) Provisional application No. 60/664,286, filed on Mar. 17, 2005.

(51) Int. Cl.
*H01L 29/06* (2006.01)
(52) U.S. Cl. .................. 257/14; 257/24; 257/E29.316; 439/962; 439/E49.003
(58) Field of Classification Search .................. 257/9, 257/14, 23–25, 188, 192, 200, 201, 321; 438/172, 962
See application file for complete search history.

(56) References Cited

U.S. PATENT DOCUMENTS

| 5,654,558 A | 8/1997 | Meyer et al. |
| 5,665,618 A | 9/1997 | Meyer et al. |
| 5,804,475 A * | 9/1998 | Meyer et al. ............... 438/172 |

OTHER PUBLICATIONS

Jones et al., "Quantum steering of electron wave function in an InAs Y-branch switch" *Appl. Phys. Lett.*, 86, 073177 (2005).
Hu et al., "On-demand single-photon source using a nanoscale metal-insulator-semiconductor capacitor" *Nanotechnol.*, 16(8), 1354 (2005).

* cited by examiner

*Primary Examiner*—Quoc Hoang
(74) *Attorney, Agent, or Firm*—John J. Karasek; Joseph T. Grunkemeyer

(57) ABSTRACT

A transistor having a bottom dielectric layer, a first layer, a second layer, a top dielectric layer, and a gate electrode. The first layer and the second layer form a composite quantum well between the bottom dielectric layer and the top dielectric layer. The first layer, the second layer, and the top dielectric layer are configured to form a hole wire in the first layer. The gate electrode is over a portion of the hole wire and divides the top dielectric layer into a source contact and a drain contact.

21 Claims, 3 Drawing Sheets

ENHANCEMENT MODE SINGLE ELECTRON TRANSISTOR

CROSS REFERENCE TO RELATED APPLICATIONS

This application claims the benefit of U.S. Provisional Patent Application No. 60/664,286 filed on Mar. 17, 2005, incorporated herein by reference.

FIELD OF THE INVENTION

The invention relates generally to single electron transistors and resonant tunneling transistors.

DESCRIPTION OF RELATED ART

Physical implementations of quantum computing have been actively searched for the last decade. One issue is scaling quantum systems up to a large number of logical qubits, which consist of physical qubits and quantum gates. Solid state and semiconductor implementations of qubits may be scalable. Among various scalable schemes that have been proposed as qubits, single electron in quantum dots (QDs) is a promising candidate. The spin of a single electron in magnetic field provides a two-level system, a criterion for realization of a qubit in a quantum computer.

Qubit spins need to be initialized, manipulated, entangled, and read out. It is therefore necessary to precisely control qubit spins. In this context, lateral quantum dots, in which spin detection is carried out by charge spectroscopy in the Coulomb blockade regime, are especially attractive because their properties are controlled by electrostatic gates. GaAs/AlGaAs lateral QDs represent a successful example of gate-controlled system, in which single spin QDs and coupling of dots have been demonstrated. The key ingredient of this success was the use of split electrostatic gates for creating lateral depletion mode single electron transistors (SETs), where two lateral tunneling barriers created by electrostatic gates define the QD (Elzerman et al., "Few-electron quantum dot circuit with integrated charge read out," *Phys. Rev. B,* 67(16), 161308 (2003). All referenced publications and patent documents are incorporated herein by reference.). The advantage of the lateral QDs is that coupling between qubits can be created also with electrostatic metal gates (Burkard et al., "Coupled quantum dots as quantum gates," *Phys. Rev. B,* 59(3), 2070 (1999)), which can be operated at sub-THz speed. This can allow millions of qubit and gate operations performed within the qubit spin lifetime, i.e., spin dephasing time.

Lateral depletion mode SETs have drawbacks: In this system, the number of electrons in the QD is reduced from hundreds down to one by a plunger gate, and there is an uncertainty in verifying the last electron in the dot. The reason is that this identification is usually carried out by measuring the conductance through the dot, and the plunger gate, while reducing the numbers of electrons, simultaneously raises the tunneling barriers and eventually shuts down the conductance. Several electrons may remain in the dot in this case, preventing the dot from being a single-spin qubit. To circumvent this drawback, an additional quantum point contact (QPC) adjacent to the SET is inserted to serve as an electrometer to verify the status when a single electron remains in the dot. Nevertheless, the necessity for QPCs hinders the ability of scaling the system to a large number of qubits and quantum gates.

In contrast to the lateral QDs, vertical InGaAs QDs have well defined tunneling barriers determined by the conduction band offset with the AlGaAs layers. As a result, there is no ambiguity in identifying a single electron in the dot by conductance. Unfortunately, in this setting, it is difficult to introduce couplings between pairs of vertical dots.

BRIEF SUMMARY OF THE INVENTION

The invention comprises a transistor comprising: a bottom dielectric layer; a first layer on at least a portion of the bottom dielectric layer; a second layer on at least a portion of the first layer; a top dielectric layer on at least a portion of the second layer; and a gate electrode on a portion of the top dielectric layer. At least one of the bottom dielectric layer and the top dielectric layer is partially p-doped. The first layer has a first bandgap defining a maximum valance energy level below the first bandgap and above the Fermi energy of the first layer. The second layer has a second bandgap defining a minimum conduction energy level above the second bandgap. The second layer comprises a material having a bulk bandgap when the material is in bulk form. The second layer has a thickness that is less than a maximum thickness, such that the second bandgap is larger than the bulk bandgap, and such that the minimum conduction energy level is within the first bandgap. The maximum valance energy level and the Fermi energy are within the second bandgap. The first layer and the second layer form a composite quantum well between the bottom dielectric layer and the top dielectric layer. The first layer, the second layer, and the top dielectric layer are configured to form a hole wire in the first layer. The gate electrode is over a portion of the hole wire and divides the top dielectric layer into a source contact and a drain contact. The gate electrode comprises a metal layer on an oxide layer.

The invention further comprises a method of making a transistor comprising: depositing the above first layer on at least a portion of the above bottom dielectric layer; depositing the above second layer on at least a portion of the first layer; depositing the above top dielectric layer on at least a portion of the second layer; and depositing a gate electrode on a portion of the top dielectric layer over a portion of the hole wire. The gate electrode divides the top dielectric layer into a source electrode and a drain electrode.

The invention further comprises a method of etching comprising: providing a heterostructure comprising $Al_xGa_{1-x}Sb$; providing an etchant solution comprising hydrofluoric acid, hydrogen peroxide, and lactic acid; and contacting the etchant solution to the $Al_xGa_{1-x}Sb$ to etch the $Al_xGa_{1-x}Sb$. The ratios of the hydrofluoric acid, hydrogen peroxide, and lactic acid in the etchant solution are from about 1:1:1:100 to about 1:1:200 by volume.

BRIEF DESCRIPTION OF THE DRAWINGS

A more complete appreciation of the invention will be readily obtained by reference to the following Description of the Example Embodiments and the accompanying drawings.

DETAILED DESCRIPTION OF EXAMPLE EMBODIMENTS

In the following description, for purposes of explanation and not limitation, specific details are set forth in order to provide a thorough understanding of the present invention. However, it will be apparent to one skilled in the art that the present invention may be practiced in other embodiments that depart from these specific details. In other instances, detailed descriptions of well-known methods and devices are omitted so as to not obscure the description of the present invention with unnecessary detail.

Some embodiments may be referred to as an enhancement mode single electron transistor (SET), which can be used, e.g., as a building block for quantum computing. In contrast to the depletion mode SETs commonly used so far, the approach using, for example, InAs/GaSb composite quantum wells, may allow for straightforward initialization and feasible scalability. In addition, due to the inherent properties of InAs nanodevices, the operating temperature of the enhancement mode SET may be higher.

Figure 1:
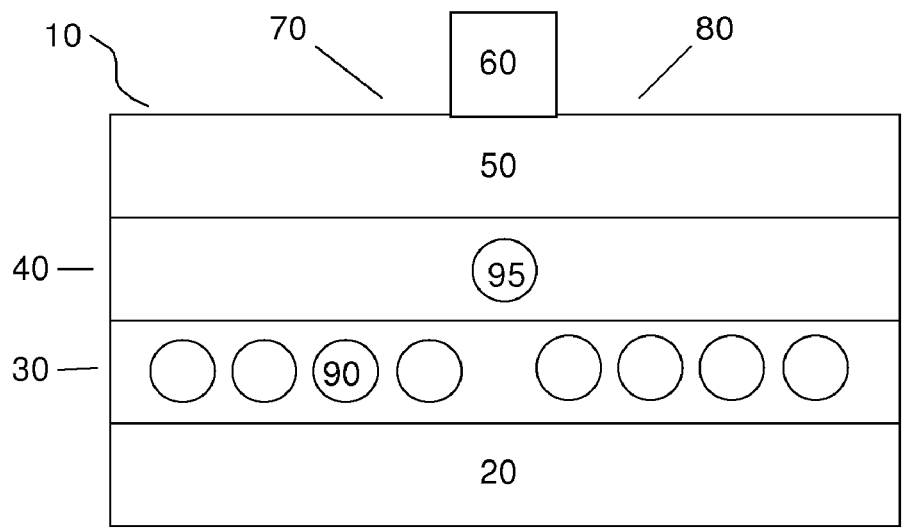
FIG. 1 schematically illustrates a cross-sectional view of an embodiment of a transistor.

FIG. 1 schematically illustrates a cross-sectional view of an embodiment of a transistor 10. From bottom to top, the layers are bottom dielectric layer 20, first layer 30, second layer 40, top dielectric layer 50, and gate electrode 60. The top dielectric layer 50 is divided into a source 70 and a drain 80. The first layer 30 and second layer 40 are a quantum well containing a hole wire 90 in the first layer 30 and a quantum dot 95 in the second layer 40. It is noted that as the device is symmetrical, the designations of source and drain are arbitrary and may depend on how the transistor is incorporated into a circuit. In one embodiment, the structure consists of an InAs/GaSb composite QW sandwiched by two barriers, e.g., $Al_xGa_{1-x}Sb$. Inserting ~20 nm p-doping in the bottom dielectric layer only, the top dielectric layer only, or both layers can create two-dimensional holes in the GaSb layer.

Figure 2:
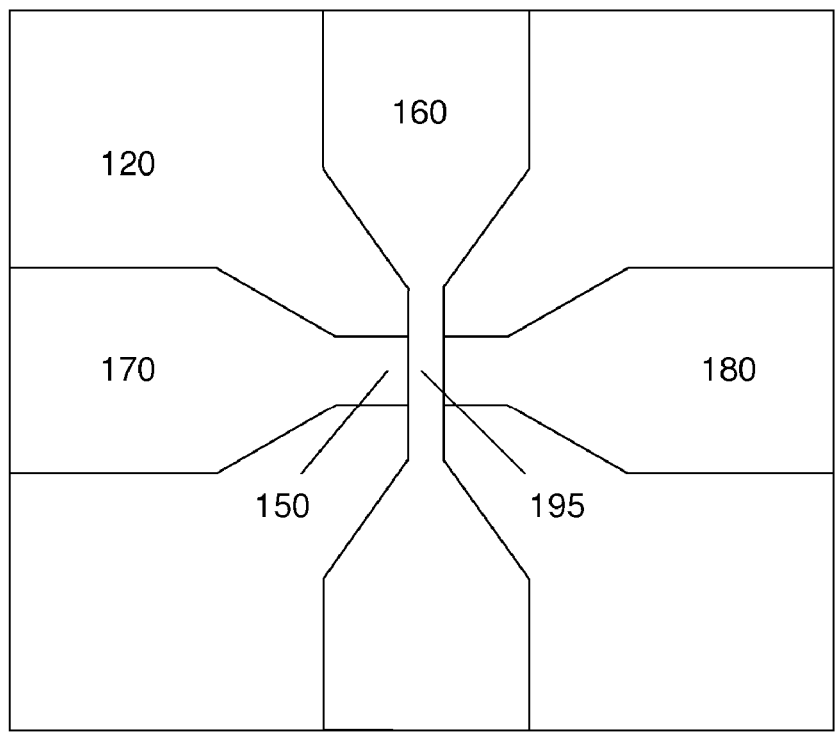
FIG. 2 schematically illustrates an overhead view of an embodiment of a transistor.

FIG. 2 schematically illustrates an overhead view of an embodiment of a transistor. The bottom dielectric layer 120 as the base layer of the entire view. The first layer (not visible), the second layer, and the top dielectric layer 150 cover a portion of the bottom dielectric layer 120. The top dielectric layer 150 contains a source 170 and a drain 180. The gate electrode 160 covers a portion of the bottom dielectric layer 120 and crosses the top dielectric layer 150. The widths of the lines at this intersection may be much smaller than pictured, including but not limited to, less than 1 micron wide or about 100 nm wide. The quantum wall and hole wire are in the rectangular section of the first layer and the second layer 140 underneath the top dielectric layer 150. The quantum dot 195 is below the intersection of the gate electrode 160 and the top dielectric layer 150.

Figure 3:
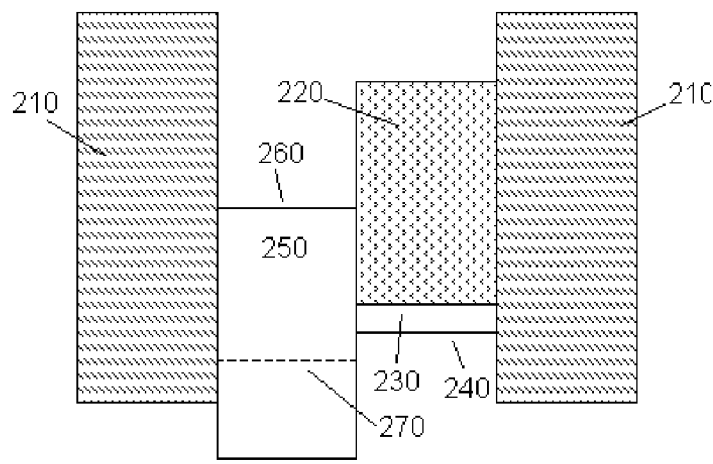
FIG. 3 shows the bandgaps and relative energy levels of the components of an embodiment of a heterostructure.

FIG. 3 shows the bandgaps and relative energy levels of the components of an embodiment of a heterostructure under zero bias. Each dielectric layer has a bandgap 210 denoted by a shaded area indicating the region between the conduction band and the valence band. The first layer has a first bandgap 220 bounded by the maximum valence energy 230 below the first bandgap 220. The Fermi energy 240 is below the maximum valence energy 230. The second layer has a second bandgap 250 bounded by the minimum conduction energy 260 above the bandgap 250. The second layer is thin enough that the minimum conduction energy 260 is raised to a level within the first bandgap 220. If the second layer were in bulk form, then it would have a bulk bandgap with a minimum conduction energy indicated by the dotted line 270.

In some embodiments, at least one barrier may be modulation p-doped so that there are two-dimensional (2D) holes in the GaSb first hole subband ($E_v$). The InAs QW may be thinner than 7 nm so that its first 2D subband energy ($E_c$) at equilibrium is far above the Fermi level ($E_f$) and resides in the GaSb bandgap.

The illustrated arrangement of bandgaps may be brought about through the selection of the materials making up the layers of the transistor. A suitable material for the top dielectric layer and/or the bottom dielectric layer may be, but is not limited to, $Al_yGa_{1-y}Sb$, including AlSb. A suitable material for the first layer may be, but is not limited to, $Al_xGa_{1-x}Sb$, including GaSb. The values of x and y may be different. A suitable material for the second layer may be, but is not limited to, InAs. Such an InAs layer may be, but is not limited to, less then 10 nm thick in order to raise the minimum conduction energy of the second layer.

The hole wire (channel) may be, but is not limited to, no more than about 1000 nm (100 nm) wide, and the dimensions of the quantum dot may be, but are not limited to, no more than about 100 nm×100 nm.

Figure 4:
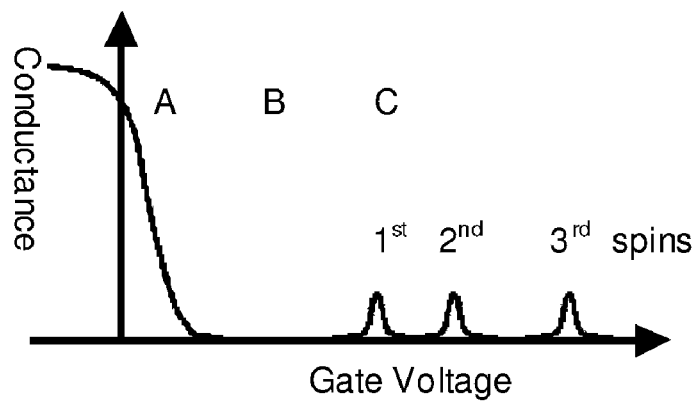
FIG. 4 schematically illustrates transconductance vs. gate voltage.

The transistor may be used as a single electron transistor. FIG. 4 shows the conductance vs. gate voltage for the single electron transistor. As a positive bias is applied to the gate, the source to drain conductance decreases from a positive value to zero. At this point there are no electrons in the quantum dot and no electrons can tunnel into or through the dot. As the gate bias is further increased, the dot can accommodate a single spin and allows for tunneling, resulting in a maximum point on the I-V curve. As the gate bias is further increased, the conductance drops back to zero and there is no tunneling. At another maximum, the quantum dot can accommodate a second spin and tunneling is again possible. One or more additional maxima allowing for additional spins may be attained by further increasing the gate bias.

Figure 5:
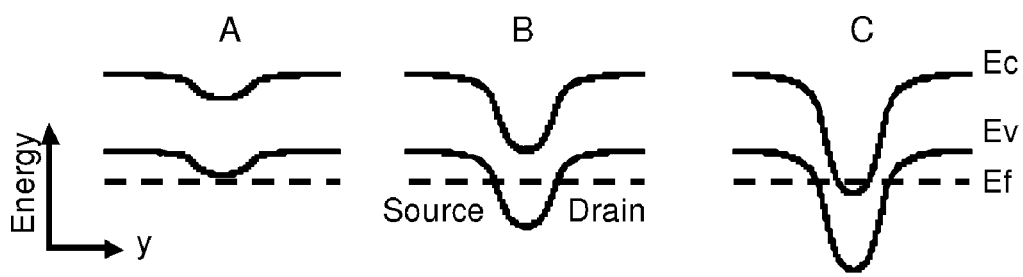
FIG. 5 schematically illustrates potential profiles along the channel direction for three voltage regimes.

FIG. 5 schematically illustrates potential profiles along the channel direction. The central portion of the profile is the quantum dot under the gate electrode and the side portions are the source and drain. The left-hand graph corresponds to region A of FIG. 4 with non-quantum conduction. Electrons are free to pass through the gate in the valence band without substantial quantum effects. The source-drain current/conductance may decrease monotonically as the gate voltage becomes more positive. It eventually vanishes when $E_v$ beneath the gate area is below the $E_f$. In region B, the valence band drops below the Fermi energy under the gate and no conduction is possible. Note, that $E_c$ follows the same potential profile as $E_v$. The source-drain current remains zero when the $E_f$ lies between the $E_v$ and $E_c$ for the band profile beneath the gate area. However, when $E_c$ under the gate area is brought into resonance with the Fermi level, the InAs layer underneath the gate is ready to host electrons. In region C, the conduction band is low enough under the gate that electrons may tunnel into, out of, and/or through the quantum dot. Electrons populate this InAs QD through holes tunneling from the GaSb layer. The barrier height for this interband Zenner tunneling is $\Delta E_z = E_c - E_v$. It is determined mainly by the InAs layer thickness. Because of the smallness of the InAs QD, electrons tunnel only one at a time. As a result, the first conductance peak is directly associated to the lowest electron state in the InAs QD.

There are two criteria to achieve SETs in the many-electron regime (hundred to thousand electrons in the dot). One is that there are two tunneling barriers and the other is that the size of the central island (the dot) needs to be small so that the Coulomb charging energy (determined by the dot capacitance) is less than the thermal energy. For example, to observe SET behavior at room temperature or He temperature, the diameter of a GaAs dot should be smaller than 13 nm or 1000 nm, respectively.

There are a number of systems that have shown SET characteristics, including GaAs, InGaAs, Si, C-nanotube, nanowires, and metal-based dots. In this regime, the device cycles through on-off states when the gate bias changes the dot by the Coulomb energy.

To push SETs into the few-electron regime, the criteria are even more stringent. Previously, there were only three reported systems that demonstrate single-electron SETs, namely depletion-mode GaAs, depletion-mode InGaAs, and single-wall C-nanotube. The enhancement mode InAs is a fourth system. In this regime, the device cycles through on-off states when the gate bias changes the dot by the sum of Coulomb, quantization, and exchange energies.

For resonant tunneling transistors (RTTs), there are also two tunneling barriers as in SETs, but the central island can be a dot (zero dimension 0D), a quantum wire (1D) or a quantum well (2D) as long as there are quantized states in the island. The tunneling mechanism is based on the energy and momentum conservations. That is, electrons can leave the emitter, enter the center region, and reach the collector if the states in these three regions have the same energy and momentum. Once the gate bias or the drain bias changes the alignment of energy states between these three regions, the tunneling current undergoes a non-linear characteristic, displaying negative differential resistance characteristics.

The enhancement-mode device may show SET characteristics when the drain bias is small and, as indicated by data, the dot size is less than 100 nm. The same device may show RTT characteristics when both the drain and the gate are strongly biased. The device may show 1D-0D-1D tunneling.

In contrast to a depletion mode SET that starts with hundreds of electrons in the central QD, the enhancement mode (EM) SET begins with zero electrons in the dot and moves from zero to one. Consequently, there is no ambiguity in identifying the voltage range that maintains a single electron in the dot. In addition, because the tunneling barrier height and the tunneling length are, to first order, independent of the top gate voltage, additional electrons can be added into the dot one by one and detected by the drain current peaks, as shown in FIG. 5. This enhancement mode SET can be used not only as a qubit, but also a readout sensor. In other words, the EM SET may be the building block for constructing compact quantum circuits, e.g., the spin logic gate can be realized in a simple way.

The transistor may also function as a resonant tunneling transistor under different operating conditions. This can occur when a large enough bias is applied to the gate electrode. This embodiment may have a lateral configuration as opposed to a vertical configuration. Also, when the dot size of the proposed transistor is increased from a few tens of nanometers to a few microns, the transconductance transforms from single electron characteristic to a unique lateral resonant-interband transistor, which has two "ON" ranges isolated by an "OFF" state.

In addition, the vertical electrical gate design is in line with the current downscaling trend of DRAM fabrication, and as a result, the scalability can be realized with a simple architecture scheme. Although the invention is not limited to the use of InAs, it has a number of advantages for quantum information applications in comparison with other semiconductors, e.g., GaAs or Si. First, InAs has a large g-factor (15 vs. 0.44 for GaAs) so that the same Zeeman energy may be obtained with a magnetic field 30 times smaller, an economic operation. Second, the dependence of g-factor on energy is strong in InAs (60 vs. 4.5 for GaAs). This makes it possible to access an individual qubit by adjusting the size of QDs. Third, the sublevel energy spacing in InAs QDs is larger due to a smaller electron mass and a steeper lateral confinement potential. Experimental data indicate a 10 meV sublevel spacing in 70 nm wires and a 20 meV spacing for a QD 50 nm in diameter. A large energy spacing can reduce the interlevel mixing through spin-orbit interaction and, as a result, suppresses the spin flip rate, which means a long spin coherence time. It is also known that a larger energy spacing and/or a smaller dot size infer a higher operating temperature of SETs. Fourth, a steep lateral potential profile means two InAs QDs can be placed in close vicinity to enhance entanglement strength.

Figure 6:
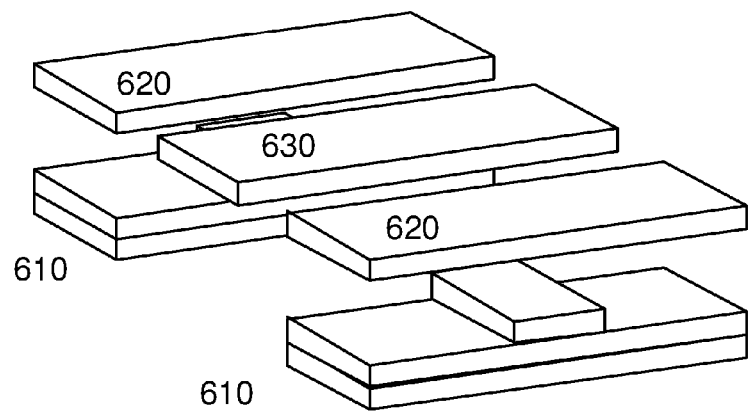
FIG. 6 schematically illustrates an embodiment of a transistor having an isolation gate and a coupling gate.
Figure 7:
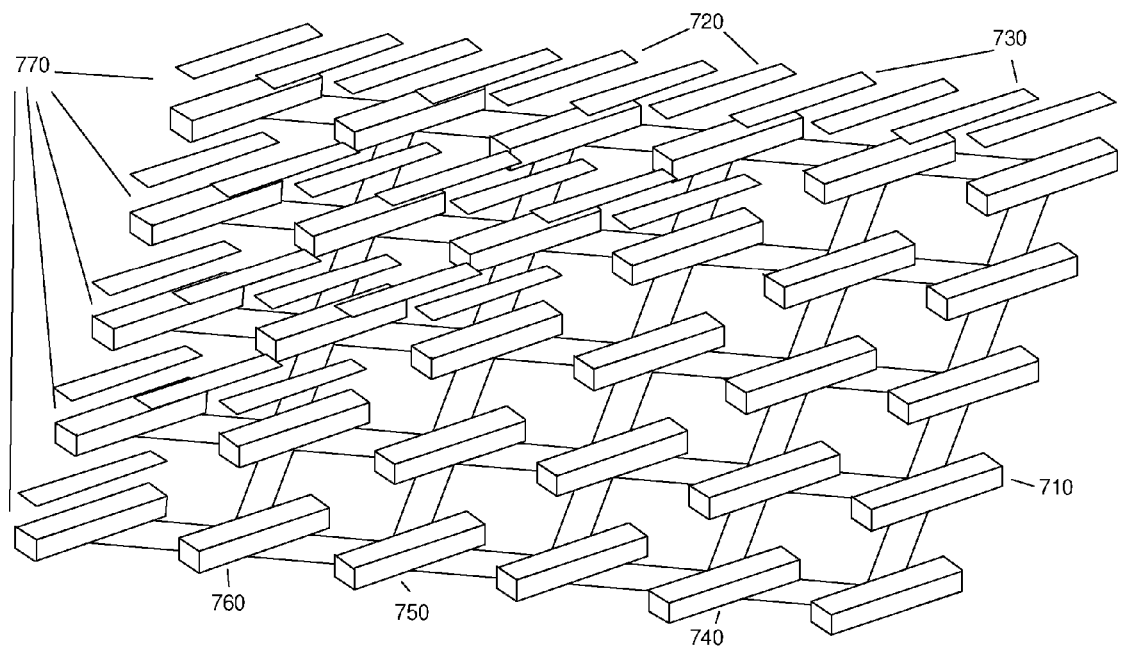
FIG. 7 schematically illustrates a portion of a quantum computing device.

More complex devices may be made from the transistor. As schematically illustrated in FIG. 6, an isolation gate electrode 620 may be juxtaposed to the transistor 610. When a voltage is applied to the isolation gate, the spin coherence time of the single electron is maximized by controlling the tunneling probability between the single spin and the source/drain leads. When ac voltagies are applied to the gate electrode (160 in FIG. 2) and the isolation gate, that produce microwave magnetic fields parallel to quantum dot layer and perpendicular to each other. Due to the presence of two perpendicular ac magnetic fields in this scheme, spin rotation is achieved over any angle around arbitrary axis. A logic gate may be constructed as schematically illustrated in FIG. 6 from two transistors and a coupling gate 630. A voltage applied to the coupling gate can cause entanglement among one or more electrons in each quantum dot. Further a portion of a quantum computing device is schematically illustrated in FIG. 7. A plurality of qubits 710 being transistors are arrayed with isolation gates 720 and coupling gates 730. The device includes syndrome qubits 740, primary qubits 750, readout dots 760, and charge readout SETs 770.

The transistor may be made by building up layers of the appropriate materials, optionally on a substrate. The layers may be formed by any known method for forming such layers, including but not limited to molecular beam epitaxy, chemical vapor deposition, and metal evaporation. The layers may be formed in the final configuration for forming the hole wire and quantum dot. Alternatively, larger areas of each layer may be made, including complete coverage of the previous layer, followed by removal of a portion of the deposited material to form the hole wire and quantum dot. The removal may be performed by reactive ion etching or chemical etching of the first layer, the second layer, and the top dielectric layer.

When the top dielectric layer and the first layer are $Al_xGa_{1-x}Sb$ and $Al_yGa_{1-y}Sb$, such chemical etching may be done with a solution comprising hydrofluoric acid, hydrogen peroxide, and lactic acid. The volumetric ratio of these ingredients may be from about 1:1:100 to about 1:1:200. When the second layer is InAs, the chemical etching may be done with a solution comprising acetic acid, hydrogen peroxide, and water.

What is claimed as new and desired to be protected by Letters Patent of the United States is:

1. A transistor comprising:
a bottom dielectric layer;
a first layer on at least a portion of the bottom dielectric layer and having a first bandgap defining a maximum valance energy level below the first bandgap and above the Fermi energy of the first layer;
a second layer on at least a portion of the first layer and having a second bandgap defining a minimum conduction energy level above the second bandgap;
wherein the second layer comprises a material having a bulk bandgap when the material is in bulk form;
wherein the second layer has a thickness that is less than a maximum thickness, such that the second bandgap is larger than the bulk bandgap, and such that the minimum conduction energy level is within the first bandgap; and
wherein the maximum valance energy level and the Fermi energy are within the second bandgap;
a top dielectric layer on at least a portion of the second layer;
wherein at least one of the bottom dielectric layer and the top dielectric layer is partially p-doped;
wherein the first layer and the second layer form a composite quantum well between the bottom dielectric layer and the top dielectric layer; and
wherein the first layer, the second layer, and the top dielectric layer are configured to form a hole wire in the first layer; and
a gate electrode on a portion of the top dielectric layer over a portion of the hole wire;
wherein the gate electrode divides the top dielectric layer into a source contact and a drain contact;
wherein the gate electrode comprising a metal layer and an oxide layer.

2. The transistor of claim 1, wherein the first layer comprises $Al_xGa_{1-x}Sb$.

3. The transistor of claim 1;
wherein the second layer comprises InAs; and
wherein the thickness of the second layer is less than about 10 nm.

4. The transistor of claim 1, wherein the bottom dielectric layer and the top dielectric layer both comprise $Al_yGa_{1-y}Sb$.

5. The transistor of claim 1, wherein the hole conducting channel is no more than about 100 nm wide.

6. The transistor of claim 1, wherein a portion of the second layer below the gate electrode and above the hole wire is a quantum dot.

7. The transistor of claim 6, wherein the dimensions of the quantum dot are no more than about 100 nm×100 nm.

8. The transistor of claim 6, further comprising:
an isolation gate electrode, whereby a voltage applied to the isolation gate changes the probability of an electron coupling to or tunneling into or out of the adjacent quantum dot.

9. A logic gate comprising:
two of the transistors of claim 1; and
a coupling gate between the transistors, whereby a voltage applied to the coupling gate can cause entanglement among one or more electrons in each quantum dot.

10. A quantum computing device comprising a plurality of qubits, at least one qubit comprising the transistor of claim 1.

11. A method of using the transistor of claim 1 comprising:
increasing a positive bias applied to the gate electrode until the source to drain conductance decreases to zero.

12. The method of claim 11, further comprising:
further increasing the bias until the conductance increases to a maximum.

13. The method of claim 12, further comprising:
further increasing the bias until the conductance returns to zero.

14. The method of claim 13, further comprising:
further increasing the bias to one or more additional conductance maxima.

15. A method of using the transistor of claim 1 comprising:
applying a positive bias to the gate electrode of a magnitude that causes the transistor to exhibit resonant tunneling transistor behavior.

16. A method of making a transistor comprising:
depositing a first layer on at least a portion of a bottom dielectric layer, wherein the first layer has a first bandgap defining a maximum valance energy level below the first bandgap and above the Fermi energy of the first layer;
depositing a second layer on at least a portion of the first layer;
wherein the second layer has a second bandgap defining a minimum conduction energy level above the second bandgap;
wherein the second layer comprises a material having a bulk bandgap when the material is in bulk form;
wherein the second layer has a thickness that is less than a maximum thickness, such that the second bandgap is larger than the bulk bandgap, and such that the minimum conduction energy level is within the first bandgap; and
wherein the maximum valance energy level and the Fermi energy are within the second bandgap;
depositing a top dielectric layer on at least a portion of the second layer;
wherein at least one of the bottom dielectric layer and the top dielectric layer is partially p-doped;
wherein the first layer and the second layer form a quantum well between the bottom dielectric layer and the top dielectric layer; and
wherein the first layer, the second layer, and the top dielectric layer are configured to form a hole wire in the first layer;
depositing a gate electrode on a portion of the top dielectric layer over a portion of the hole wire;
wherein the gate electrode divides the top dielectric layer into a source electrode and a drain electrode.

17. The method of claim 16;
wherein the first layer comprises $Al_xGa_{1-x}Sb$;
wherein the second layer comprises InAs;
wherein the thickness of the second layer is less than about 10 nm;

wherein the bottom dielectric layer and the top dielectric layer both comprise $Al_yGa_{1-y}Sb$; and wherein the gate electrode comprises a metal layer on an oxide layer.

18. The method of claim 17, wherein the first layer, the second layer, and the top dielectric layer are configured to form a hole wire by etching of a portion of each of the first layer, the second layer, and the top dielectric layer.

19. The method of claim 18;

wherein etching the top dielectric layer and the first layer comprises chemical etching with a solution comprising hydrofluoric acid, hydrogen peroxide, and lactic acid; and wherein etching the second layer comprises chemical etching with a solution comprising acetic acid, hydrogen peroxide and water.

20. The method of claim 19, wherein the ratios of the hydrofluoric acid, hydrogen peroxide, and lactic acid in the etchant solution are from about 1:1:100 to about 1:1:200 by volume.

21. The method of claim 16, wherein each depositing step is performed by a method independently selected from the group consisting of molecular beam epitaxy, chemical vapor deposition, and metal evaporation.

* * * * *

UNITED STATES PATENT AND TRADEMARK OFFICE
CERTIFICATE OF CORRECTION

| | |
|---|---|
| PATENT NO. | : 7,208,753 B2 |
| APPLICATION NO. | : 11/307830 |
| DATED | : April 24, 2007 |
| INVENTOR(S) | : Ming Jey Yang et al. |

It is certified that error appears in the above-identified patent and that said Letters Patent is hereby corrected as shown below:

On the title page: item [75]

Change inventor "Ming Yang" to --Ming Jey Yang--.

Signed and Sealed this

Twenty-sixth Day of June, 2007

JON W. DUDAS
*Director of the United States Patent and Trademark Office*